United States Patent
Gaurav et al.

(10) Patent No.: US 10,536,165 B1
(45) Date of Patent: Jan. 14, 2020

(54) PROGRAMMABLE BIT ALIGNMENT AT SERIAL-TO-PARALLEL STAGE OF SERDES

(71) Applicant: QUALCOMM Incorporated, San Diego, CA (US)

(72) Inventors: Anand Gaurav, San Diego, CA (US); Bo Sun, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/280,985

(22) Filed: Feb. 20, 2019

(51) Int. Cl.
*H03M 9/00* (2006.01)
*H04J 1/08* (2006.01)

(52) U.S. Cl.
CPC ............... *H03M 9/00* (2013.01); *H04J 1/085* (2013.01)

(58) Field of Classification Search
CPC .................................. H03M 9/00; H04J 1/085
USPC .................................................. 341/100, 101
See application file for complete search history.

(56) References Cited

U.S. PATENT DOCUMENTS

| 7,127,645 | B2 * | 10/2006 | Toyoda | H04L 7/04 714/700 |
| 8,570,196 | B1 * | 10/2013 | Liu | G09G 5/006 341/100 |
| 8,878,706 | B2 * | 11/2014 | Fujita | H03M 9/00 341/101 |
| 8,897,080 | B2 * | 11/2014 | Tsai | G11C 7/1036 365/189.05 |

* cited by examiner

*Primary Examiner* — Brian K Young
(74) *Attorney, Agent, or Firm* — Loza & Loza, LLP/Qualcomm

(57) ABSTRACT

In certain aspects, a serial-to-parallel converter includes multiple cascaded stages configured to convert a serial data stream into multiple parallel data signals, wherein each of the stages includes one or more demultiplexers. The serial-to-parallel converter also includes demultiplexer control circuits, wherein each of the demultiplexer control circuits is coupled to the one or more demultiplexers of a respective one of the stages, and a pattern detector coupled to the demultiplexer control circuits.

21 Claims, 7 Drawing Sheets

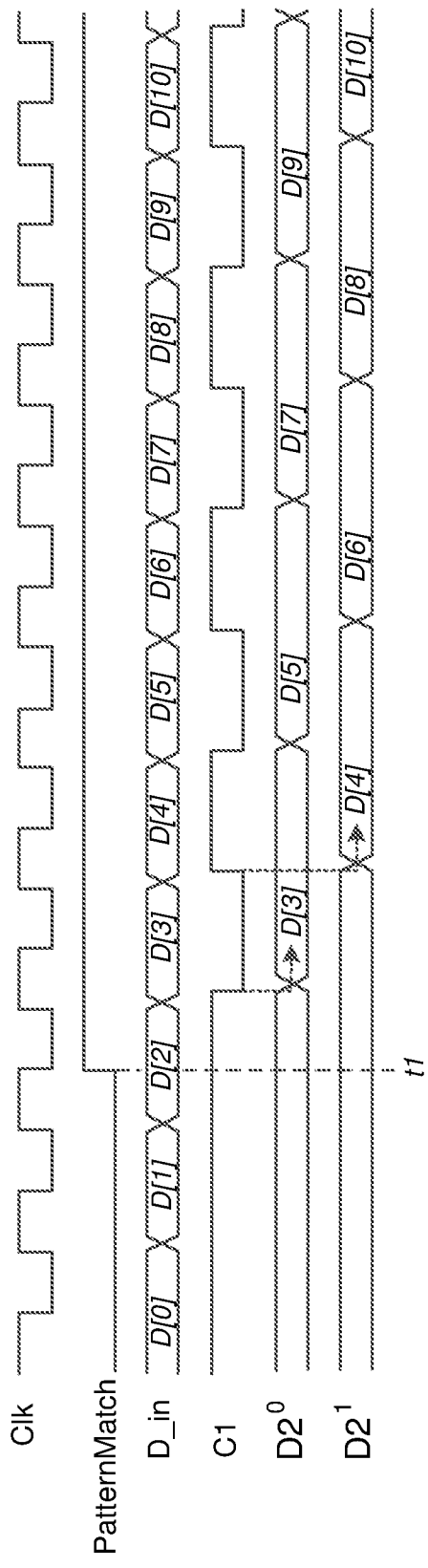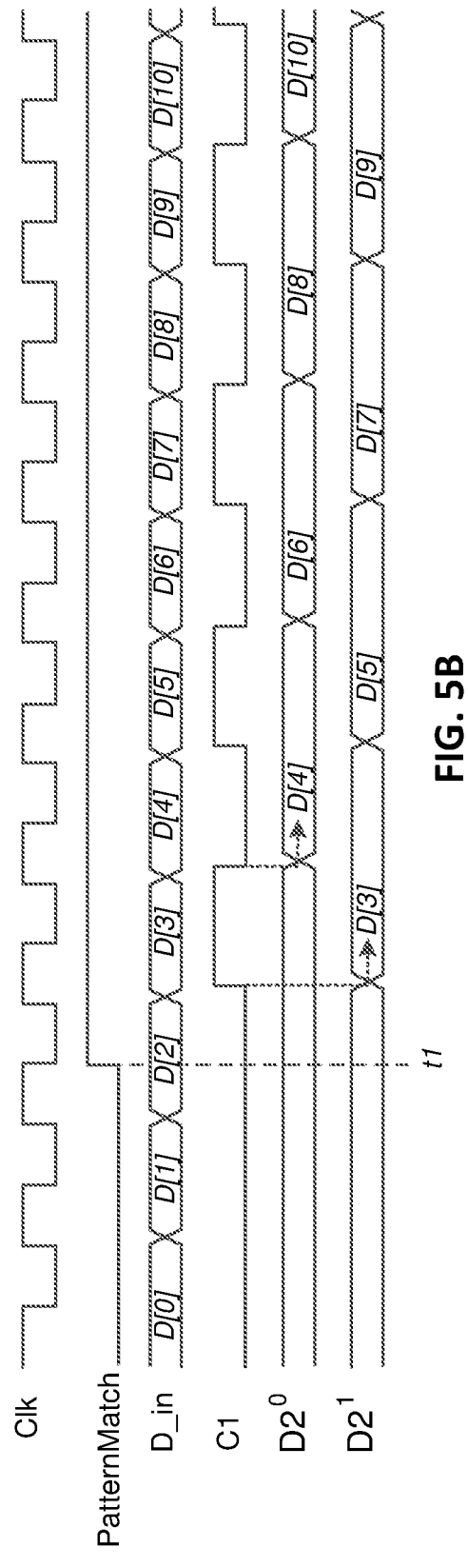
FIG. 5A
FIG. 5B

PROGRAMMABLE BIT ALIGNMENT AT SERIAL-TO-PARALLEL STAGE OF SERDES

BACKGROUND

Field

Aspects of the present disclosure relate generally to high-speed communication, and more particularly, to serial-to-parallel converters in high-speed communication.

Background

Serializer/Deserializer (SerDes) is used to provide high-speed communication between two chips over a serial link Transmitting data between chips over a serial link instead of a parallel bus reduces cost and area by reducing the number of pins on the chips and the number of interconnects between the chips.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a serial-to-parallel converter. The serial-to-parallel converter includes multiple cascaded stages configured to convert a serial data stream into multiple parallel data signals, wherein each of the stages includes one or more demultiplexers. The serial-to-parallel converter also includes demultiplexer control circuits, wherein each of the demultiplexer control circuits is coupled to the one or more demultiplexers of a respective one of the stages, and a pattern detector coupled to the demultiplexer control circuits.

A second aspect relates to an apparatus. The apparatus includes a demultiplexer configured to receive a serial data stream and split the serial data stream into first and second parallel data signals. The apparatus also includes a demultiplexer control circuit coupled to the demultiplexer, and a pattern detector coupled to the demultiplexer control circuit.

A third aspect relates to a method for operating a serial-to-parallel converter. The serial-to-parallel converter includes multiple cascaded stages configured to convert a serial data stream into multiple parallel data signals, wherein each of the stages includes one or more demultiplexers. The method includes detecting a pattern in the serial data stream, and, for each of the stages, outputting a respective clock signal to the one or more demultiplexers of the stage upon detecting the pattern.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

BRIEF DESCRIPTION OF THE DRAWINGS

FIG. 5A is a timing diagram illustrating an example of bit mapping for a demultiplexer according to certain aspects of the present disclosure.

FIG. 5B is a timing diagram illustrating another example of bit mapping for the demultiplexer according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

SerDes is used to provide high-speed communication (e.g., multiple gigabits per second (e.g., Gbps)) between two chips over a serial link. For example, a first chip may transmit data to a second chip over a serial link using SerDes. In this example, the first chip includes a parallel-to-serial converter (i.e., a serializer) and a transmitter, and the second chip includes a receiver and a serial-to-parallel converter (i.e., a deserializer). The serial link may be differential and may include one or more wires, one or more metal traces (e.g., on a circuit board), etc.

At the first chip, the parallel-to-serial converter converts the data into a serial data stream (e.g., a serial bit stream), and the transmitter transmits the serial data stream to the second chip over the serial link. At the second chip, the receiver receives the serial data stream, and the serial-to-parallel converter converts the received serial data stream into parallel data. The parallel data may be output to one or more processors on the second chip for further processing. It is to be appreciated that the second chip may also transmit data to the first chip over the same serial link or another serial link for bidirectional communication.

Conventionally, a serial-to-parallel converter (i.e., the deserializer) is followed by significant hardware for performing bit alignment and mapping of the parallel data. The hardware may include multibit-XOR gates, an align FIFO, a match engine, a barrel shifter, and/or other components. The hardware may consume a significant amount of power and occupy a large chip area.

To reduce or eliminate the above hardware following the serial-to-parallel converter, aspects of the present disclosure incorporate programmable mapping of serial data to parallel data into the serial-to-parallel converter (i.e., the deserializer). By reducing or eliminating the hardware following the serial-to-parallel converter, aspects of the present disclosure reduce the power and/or area needed for SerDes.

Figure 1:
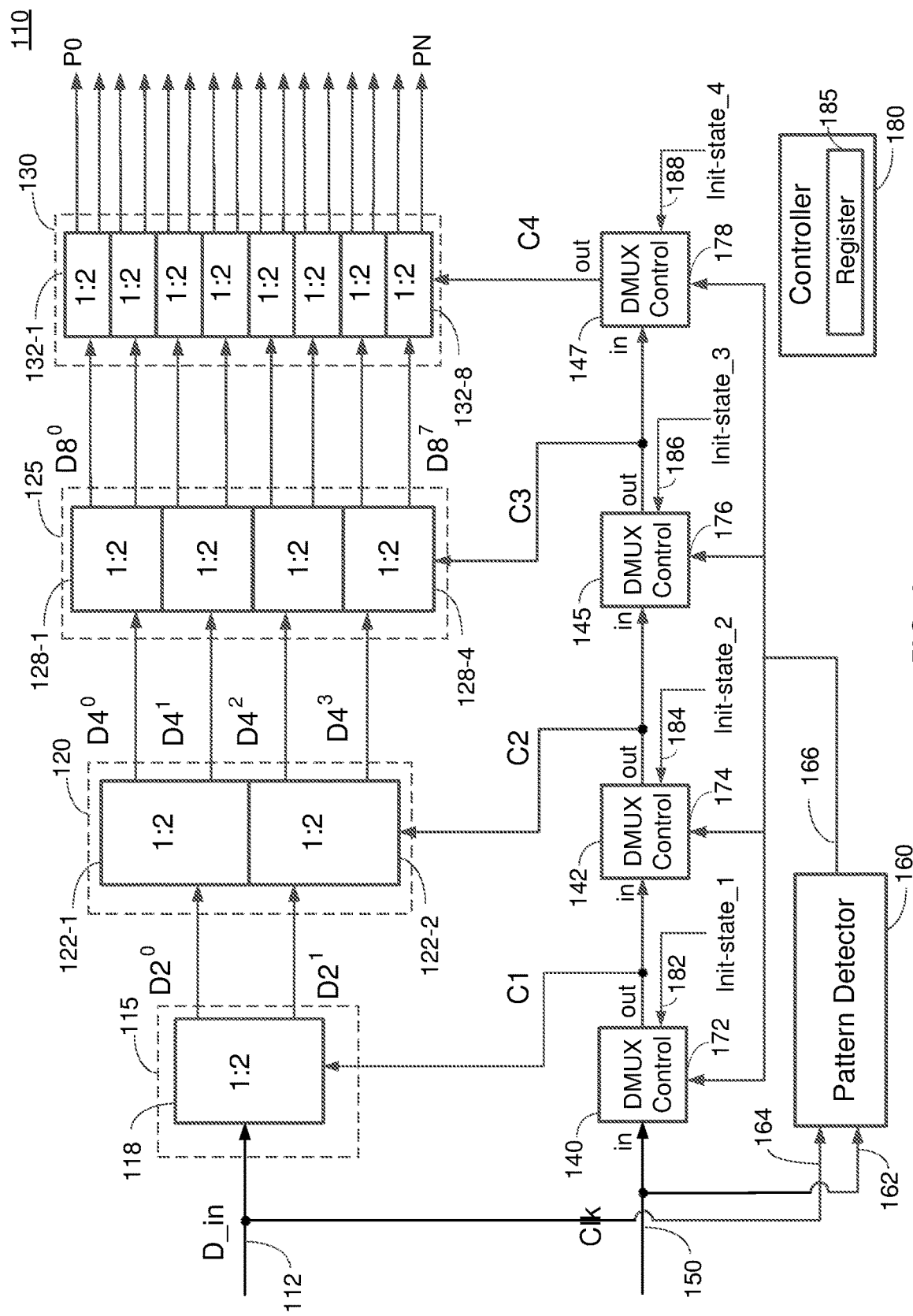
FIG. 1 shows an example of a serial-to-parallel converter according to certain aspects of the present disclosure.

FIG. 1 shows an example of a serial-to-parallel converter 110 (i.e., a deserializer) according to certain aspects. The serial-to-parallel converter 110 has a data input 112 and a clock input 150. The serial-to-parallel converter 110 is configured to receive an input serial data stream (labeled "D_in") at the data input 112, and convert the received input serial data stream D_in into output parallel data (labeled "P0" to "PN").

In the example shown in FIG. 1, the serial-to-parallel converter 110 includes multiple cascaded stages 115, 120, 125 and 130 (e.g., four stages) configured to convert the input serial data steam D_in into multiple parallel data signals P0 to PN. In normal operation, the first stage 115 splits the input serial data stream D_in into two parallel data signals (labeled "D2$^0$" and "D2$^1$"), and outputs the two parallel data signals D2$^0$ and D2$^1$ to the second stage 120. The second stage 120 splits the two parallel data signals D2$^0$ and D2$^1$ from the first stage 115 into four parallel data signals (labeled "D4$^0$" to "D4$^3$"), and outputs the four parallel data signals D4$^0$ to D4$^3$ to the third stage 125. The third stage 125 splits the four parallel data signals D4$^0$ to D4$^3$ from the second stage 120 into eight parallel data signals (labeled "D8$^0$" to "D8$^7$"), and outputs the eight parallel data signals D8$^0$ to D8$^7$ to the fourth stage 130. The fourth stage 130 splits the eight parallel data signals D8$^0$ to D8$^7$ from the third stage 125 into the output parallel data signals P0 to PN. Thus, each stage of the serial-to-parallel converter 110 increases the number of data signals by a factor of two.

Although the serial-to-parallel converter 110 in the example shown in FIG. 1 has four stages, it is to be appreciated that the present disclosure is not limited to this example. For example, the serial-to-parallel converter 110 may include five stages to convert the input serial data stream D_in into 32 parallel data signals (e.g., convert 32 serial bits in the input serial data stream D_in into 32 parallel bits). In general, the serial-to-parallel converter 110 may convert the input serial data stream D_in into $2^k$ parallel data signals where k is the number of stages in the serial-to-parallel converter 110. However, it is to be appreciated that the present disclosure is not limited to a $2^k$ parallel data format. The serial-to-parallel converter 110 may output any number of parallel data signals. For example, the serial-to-parallel converter 110 may be implemented as a 1-to-80 serial-to-parallel converter, a 1-to-64 serial-to-parallel converter, etc.

In the example shown in FIG. 1, each stage 115, 120, 125 and 130 includes one or more one-to-two (1:2) demultiplexers. Each 1:2 demultiplexer is configured to receive an input data signal, and split the received input data signal into two parallel data signals. The first stage 115 includes one 1:2 demultiplexer 118, the second stage 120 includes two 1:2 demultiplexers 122-1 and 122-2, the third stage 125 includes four 1:2 demultiplexers 128-1 to 128-4, and the fourth stage 130 includes eight 1:2 demultiplexers 132-1 to 132-8. In general, after the first stage 115, each stage in the serial-to-parallel converter 110 includes twice the number of 1:2 demultiplexers as the previous stage in the serial-to-parallel converter 110. An exemplary implementation of a 1:2 demultiplexer is discussed below with reference to FIG. 2.

The serial-to-parallel converter 110 also includes demultiplexer control circuits 140, 142, 145 and 147, in which each of the demultiplexer control circuits 140, 142, 145 and 147 is coupled to the 1:2 demultiplexer(s) in a respective one of the stages 115, 120, 125 and 130. Each of the demultiplexer control circuits 140, 142, 145 and 147 is configured to output a respective demultiplexer control signal (labeled "C1" to "C4") to the 1:2 demultiplexer(s) in the respective stage of the serial-to-parallel converter 110. For example, the demultiplexer control circuit 140 outputs the demultiplexer control signal C1 to the 1:2 demultiplexer 118 in the first stage 120, the demultiplexer control circuit 142 outputs the demultiplexer control signal C2 to the 1:2 demultiplexers 122-1 and 122-2 in the second stage 125, and so forth.

In normal operation, each of the demultiplexer control signals C1 to C4 provides a respective clock signal that controls the timing of operations of the 1:2 demultiplexer(s) in the respective stage. Each of the demultiplexer control circuits 140, 142, 145 and 147 generates the respective clock signal as follows. The first demultiplexer control circuit 140 receives an input clock signal (labeled "Clk") at the clock input 150 and divides the frequency of the input clock signal Clk by two to generate a first clock signal having half the frequency of the input clock signal Clk. The first demultiplexer control circuit 140 outputs the first clock signal as the demultiplexer control signal C1 to the demultiplexer 118 in the first stage 115. The input clock signal Clk may be recovered from the serial data stream using a clock and data recovery circuit (not shown).

The second demultiplexer control circuit 142 receives the first clock signal from the first demultiplexer control circuit 140 and divides the frequency of the first clock signal by two to generate a second clock signal having half the frequency of the first clock signal and one fourth the frequency of the input clock signal Clk. The second demultiplexer control circuit 142 outputs the second clock signal as the demultiplexer control signal C2 to the 1:2 demultiplexers 122-1 and 122-2 in the second stage 120.

The third demultiplexer control circuit 145 receives the second clock signal from the second demultiplexer control circuit 142 and divides the frequency of the second clock signal by two to generate a third clock signal having half the frequency of the second clock signal and one eighth the frequency of the input clock signal Clk. The third demultiplexer control circuit 145 outputs the second clock signal as the demultiplexer control signal C3 to the 1:2 demultiplexers 128-1 and 128-4 in the third stage 125.

The fourth demultiplexer control circuit 147 receives the third clock signal from the third demultiplexer control circuit 145 and divides the frequency of the third clock signal by two to generate a fourth clock signal having half the frequency of the third clock signal and one sixteenth the frequency of the input clock signal Clk. The fourth demultiplexer control circuit 147 outputs the fourth clock signal as the demultiplexer control signal C4 to the 1:2 demultiplexers 132-1 and 132-8 in the fourth stage 130.

Thus, in normal operation, the demultiplexer control circuits 140, 142, 145 and 147 function as cascaded divide-by-two clock dividers. The demultiplexer 118 in the first stage 115 receives a clock signal having half the frequency of the input clock signal Clk, and the demultiplexers in each of the remaining stages receive a clock signal having half the frequency of the clock signal received by the demultiplexers in the previous stage.

Figure 2:
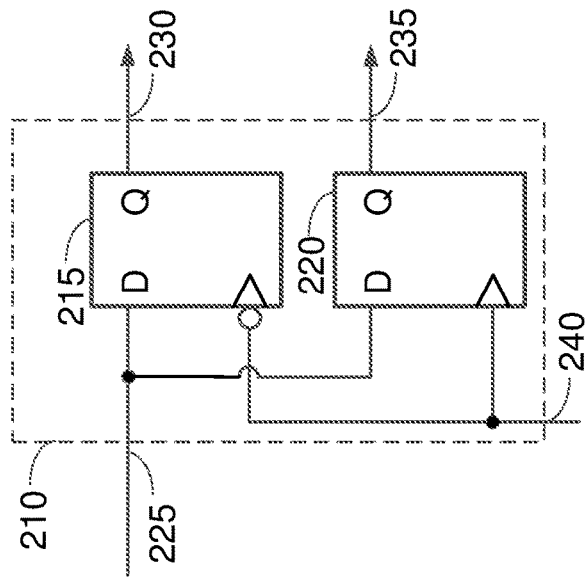
FIG. 2 shows an exemplary implementation of a one-to-two demultiplexer according to certain aspects of the present disclosure.

FIG. 2 shows an exemplary implementation of a 1:2 demultiplexer 210 according to certain aspects. The 1:2 demultiplexer 210 may be used to implement each of the 1:2 demultiplexers in FIG. 1 (i.e., each of the 1:2 demultiplexers in FIG. 1 may be a separate instance of the 1:2 demultiplexer 210).

The 1:2 demultiplexer 210 has a data input 225, a control input 240, a first output 230, and a second output 235. The 1:2 demultiplexer 210 is configured to receive an input data signal at the data input 225, and split the received input data signal into two parallel data signals. The 1:2 demultiplexer 210 outputs a first one of the parallel data signals at the first output 230, and outputs a second one of the parallel data signals at the second output 235. In normal operation, the control input 240 receives the corresponding one of the clock signals discussed above. More particularly, if the 1:2 demultiplexer 210 is in the first stage 115 of the serial-to-parallel converter 110, then the control input 240 receives the first clock signal, which has a frequency equal to half the frequency of the input clock signal Clk. If the 1:2 demultiplexer 210 is in the second stage 120 of the serial-to-parallel converter 110, then the control input 240 receives the second clock signal, and so forth.

The 1:2 demultiplexer includes a first flip-flop 215 and a second flip-flop 220. The first flip-flop 215 has a data input (labeled "D") coupled to the data input 225 of the 1:2 demultiplexer 210, an output (labeled "Q") coupled to the first output 230 of the 1:2 demultiplexer 210, and a clock input coupled to the control input 240 of the 1:2 demultiplexer 210. In normal operation, the clock input of the first flip-flop 215 receives the corresponding clock signal from the corresponding demultiplexer control circuit. The first flip-flop 215 sequentially latches data bits at the data input 225 on falling edges of the corresponding clock signal, and sequentially outputs the latched data bits at the first output 230 of the 1:2 demultiplexer 210. Note that the circle at the clock input of the first flip-flop 215 indicates that the first flip-flop 215 latches data bits on falling edges of the corresponding clock signal.

The second flip-flop 220 has a data input (labeled "D") coupled to the data input 225 of the 1:2 demultiplexer 210, an output (labeled "Q") coupled to the second output 235 of the 1:2 demultiplexer 210, and a clock input coupled to the control input 240 of the 1:2 demultiplexer 210. In normal operation, the second flip-flop 220 receives the corresponding clock signal from the corresponding demultiplexer control circuit. The second flip-flop 220 sequentially latches data bits at the data input 225 on rising edges of the corresponding clock signal, and sequentially outputs the latched data bits at the second output 235 of the 1:2 demultiplexer 210.

Figure 3:
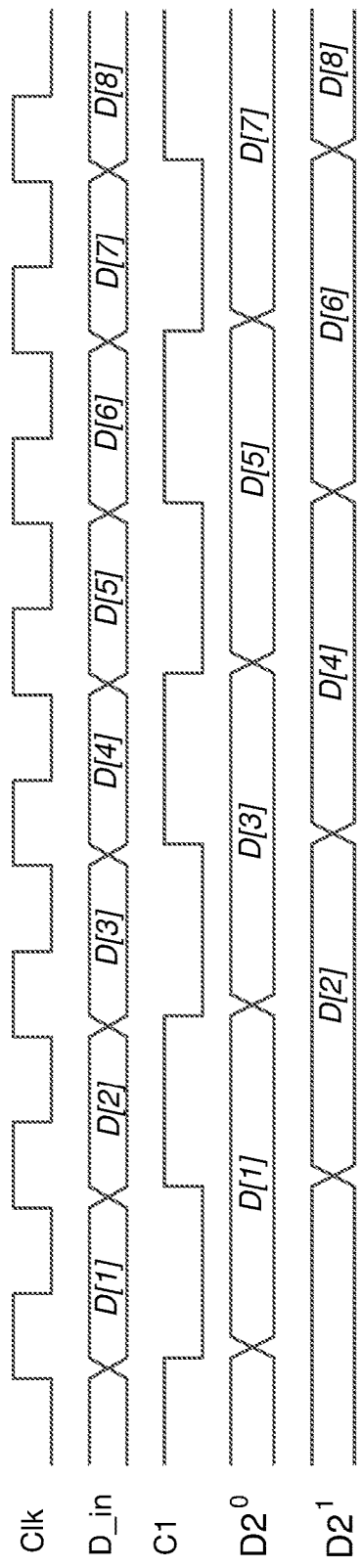
FIG. 3 is a timing diagram illustrating exemplary operations of the one-to-two demultiplexer according to certain aspects of the present disclosure.

FIG. 3 is a timing diagram illustrating exemplary operations of the 1:2 demultiplexer 210 according to aspects of the present disclosure. In the example shown in FIG. 3, the 1:2 demultiplexer 210 implements the 1:2 demultiplexer 118 in the first stage 115. The 1:2 demultiplexer 210 receives the input serial data stream D_in at the data input 225, receives the demultiplexer control signal C1 at the control input 240, and outputs the parallel data signals $D2^0$ and $D2^1$ at the first and second outputs 230 and 235, respectively. In normal operation, the demultiplexer control signal C1 provides the first clock signal, which has a frequency equal to half the frequency of the input clock signal Clk, as shown in FIG. 3.

As shown in FIG. 3, the 1:2 demultiplexer 210 receives two data bits of the input serial data stream D_in during one cycle (i.e., period) of the first clock signal (i.e., C1 in FIG. 3). The first flip-flop 215 latches one of the two data bits on a falling edge of the first clock signal, and the second flip-flop 220 latches the other one of the two data bits on a rising edge of the first clock signal. Thus, two data bits of the input serial data stream D_in received during one cycle of the first clock signal are split between the first and second outputs 230 and 235 of the 1:2 demultiplexer 210.

As discussed above, the demultiplexer 210 may be used to implement each of the 1:2 demultiplexers shown in FIG. 1. For instance, for the example in which the demultiplexer 210 implements the 1:2 demultiplexer 122-1 in FIG. 1, the demultiplexer 210 receives the data signal $D2^0$ at the data input 225, receives the control signal C2 at the control input 240, and outputs the parallel data signals $D4^0$ and $D4^1$ at the first and second outputs 230 and 235, respectively. For the example in which the demultiplexer 210 implements the 1:2 demultiplexer 122-2 in FIG. 1, the demultiplexer 210 receives the data signal $D2^1$ at the data input 225, receives the control signal C2 at the control input 240, and outputs the parallel data signals $D4^2$ and $D4^3$ at the first and second outputs 230 and 235, respectively.

FIG. 1 shows an example in which word boundary detection is incorporated into the serial-to-parallel converter 110 according to certain aspects. In this example, the device transmitting the serial data stream inserts a pattern in the serial data stream to indicate a word boundary. In this regard, the serial-to-parallel converter 110 includes a pattern detector 160 configured to detect the word boundary in the input serial data stream D_in by detecting the pattern in the input serial data stream D_in. When the pattern detector 160 detects the pattern, the pattern detector 160 outputs a pattern detection signal at the output 166 of the pattern detector 160, as discussed further below.

In this example, each of the demultiplexer control circuits 140, 142, 145 and 147 has a respective control input 172, 174, 176 and 178 coupled to the output 166 of the pattern detector 160. Before the pattern detector 160 detects the pattern (i.e., before the pattern detector 160 outputs the pattern detection signal), the demultiplexer control signal C1 to C4 of each of the demultiplexer control circuits 140, 142, 145 and 147 is set to an initial state (either a one or a zero). In this case, each of the demultiplexer control signals C1 to C4 may be held at the respective initial state until the respective demultiplexer control circuit receives the pattern detection signal from the pattern detector 160, as discussed further below.

Upon detecting the pattern in the serial data signal D_in, the pattern detector 160 outputs the pattern detection signal to the demultiplexer control circuits 140, 142, 145 and 147. In response to the pattern detection signal, each of the demultiplexer control circuits 140, 142, 145 and 147 outputs the respective clock signal as the respective demultiplexer control signal to the demultiplexer(s) in the respective stage. Thus, the clock signals of the demultiplexer control circuits 140, 142, 145 and 147 are enabled in response to the pattern detection signal. Since the pattern indicates a word boundary in the serial data stream D_in, the clock signals are enabled upon detection of the word boundary. This provides bit alignment with the word boundary.

Figure 4A:
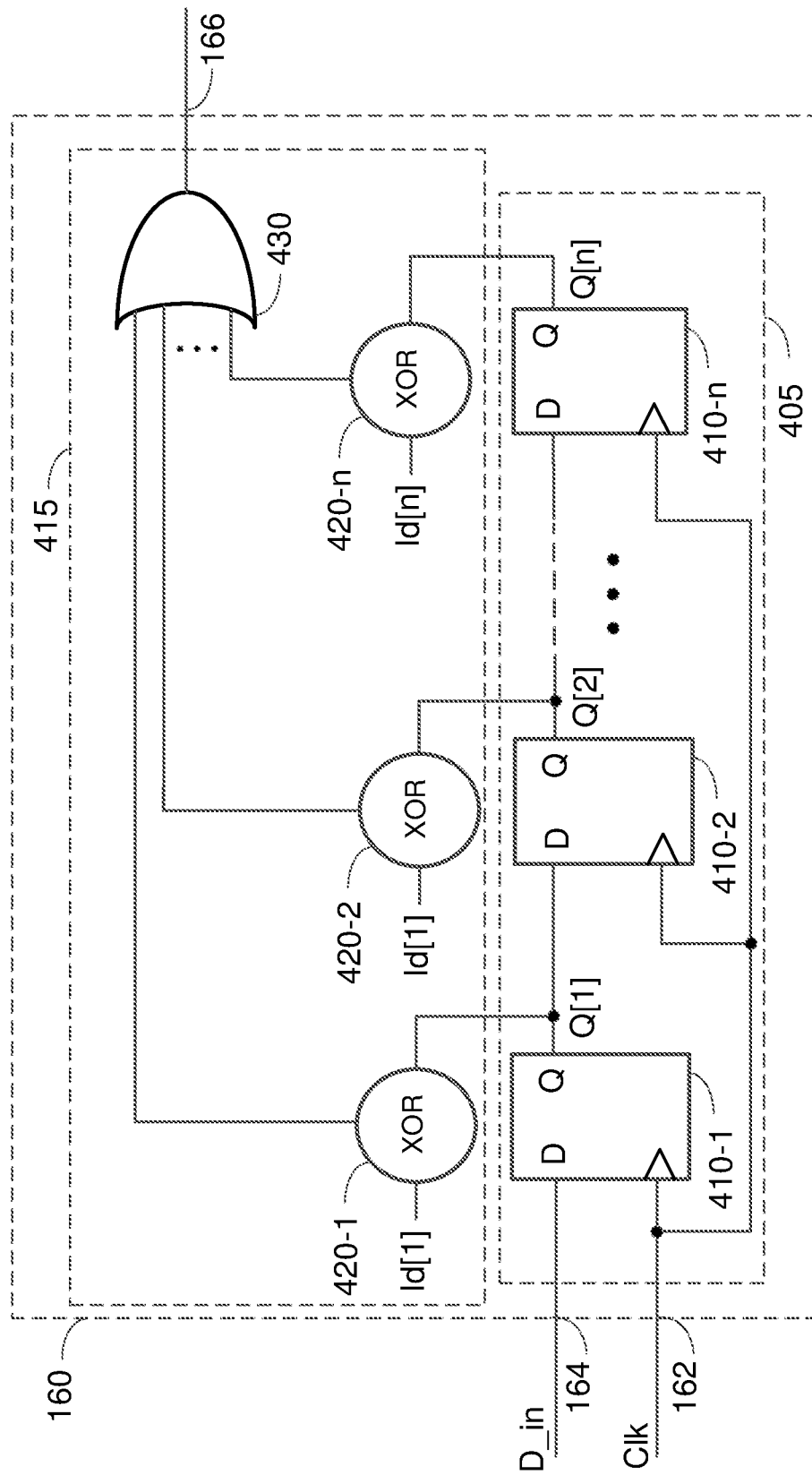
FIG. 4A shows an exemplary implementation of a pattern detector according to certain aspects of the present disclosure.

FIG. 4A shows an exemplary implementation of the pattern detector 160 according to some aspects of the present disclosure. In this example, the pattern detector 160 includes a shift register 405 and a comparator 415.

The shift register 405 has a data input 164 coupled to the data input 112 of the serial-to-parallel converter 110, and a clock input 162 coupled to the clock input 150 of the serial-to-parallel converter 110. In operation, the shift register 405 sequentially receives bits from the data input 112 and outputs the n most-recently received bits in parallel (labeled "Q[1]" to "Q[n]") to the comparator 415, where n is an integer.

The comparator 415 compares the n bits Q[1] to Q[n] from the shift register 405 with a local copy of the pattern indicating a word boundary. In this example, the pattern is a sequence of n bits (labeled "Id[1]" to "Id[n]"). If the output of the shift register 405 matches the pattern (i.e., the bits Q[1] to Q[n] match the bits Id[1] to Id[n]), then the comparator 415 detects a match and outputs the pattern detection signal at the output 166. The pattern detection signal may have a logic value of one or zero. If the output of the shift register 405 does not match the pattern (i.e., the bits Q[1] to Q[n] do not match the bits Id[1] to Id[n]), then the comparator 415 may output a logic value that is the opposite of the logic value of the pattern detection signal to indicate no pattern match.

In the example shown in FIG. 4A, the shift register 405 includes multiple cascaded flip-flops 410-1 to 410-n. Each of the flip-flops 410-1 to 410-n has a data input (labeled "D"), an output ("Q"), and a clock input. The clock input of each of the flip-flops 410-1 to 410-1 is coupled to the clock input 162 and therefore receives the input clock signal Clk. The flip-flops 410-1 to 410-n are coupled in a chain, in which the output of each of the flip-flops (except for the last flip-flop 410-n) is coupled to the input of the next flip-flop in the chain. Each of the flip-flops 410-1 to 410-n is configured to latch a bit at the respective data input (labeled "D") on a rising edge of the clock signal Clk, and output the latched bit at the respective output (labeled "Q").

In operation, a bit from the data input 164 is latched by the first flip-flop 410-1 during each cycle of the clock signal Clk. In addition, the bits in the shift register 405 (except for the last bit) are shifted to the right by one position during each cycle of the clock signal Clk. The last bit (i.e., the bit at the last flip-flop 410-n) is removed from the shift register 405 during each cycle of the clock signal Clk to make room for the new bit latched by the first flip-flop 410-1. The outputs of the flip-flops 410-1 to 410-n output the n most-recently latched bits to the comparator 415 in parallel, as shown in FIG. 4A.

In the example shown in FIG. 4A, the comparator 415 includes multiple exclusive OR (XOR) gates 420-1 to 420-n and an OR gate 430. Each of the XOR gates 420-1 to 420-n has a first input coupled to the output of a respective one of the flip-flops 410-1 to 410-n, a second input coupled to a respective one of the bits of the pattern, and an output coupled to a respective input of the OR gate 430. The output of the OR gate 430 is coupled to the output 166 of the pattern detector 160.

In operation, each of the XOR gates 420-1 to 420-n compares the bit at the output of the respective flip-flop with the respective bit of the pattern, outputs a zero if the bit at the output of the respective flip-flop matches the respective bit of the pattern, and outputs a one if the bit at the output of the respective flip-flop does not match the respective bit of the pattern. The OR gate 430 outputs a one when at least one of the XOR gates 420-1 to 420-n outputs a one to the OR gate 430. This occurs when at least one of the bits output by the shift register 405 does not match the respective bit of the pattern. Thus, in this example, the OR gate 430 outputs a one when there is no pattern match. The OR gate 430 outputs a zero when all of the XOR gates 420-1 to 420-n output a zero to the OR gate 430. This occurs when the bits output by the shift register 405 match the respective bits of the pattern. Thus, in this example, the OR gate 430 outputs a zero when there is a pattern match. In other words, the pattern detection signal has a logic value of zero in this example.

It is to be appreciated that the comparator 415 is not limited to the logic gates shown in the example in FIG. 4A. For example, the OR gate 430 may be replaced by a NOR gate, in which case the pattern match detection signal has a logic value of one. In short, the comparator 415 may be implemented using various combinations of logic gates, and is therefore not limited to the example shown in FIG. 4A.

In the example shown in FIG. 4A, the pattern detector 160 outputs a logic zero to indicate a pattern match. However, it is to be appreciated that the pattern detector 160 is not limited to this example. For example, the pattern detector 160 may instead output a logic one to indicate a pattern match. In general, the pattern detector 160 may output a first logic value at the output 166 to indicate a pattern match, and output a second logic value at the output 166 to indicate no pattern match. When the pattern detector 160 outputs the second logic value to the demultiplexer control circuits 140, 142, 145 and 147, the demultiplexer control signal of each of the demultiplexer control circuits 140, 142, 145 and 147 is held at the respective initial state. When the pattern detector 160 outputs the first logic value to the demultiplexer control circuits 140, 142, 145 and 147, each of the demultiplexer control circuits 140, 142, 145 and 147 starts outputting the respective clock signal as the respective demultiplexer control signal.

Figure 4B:
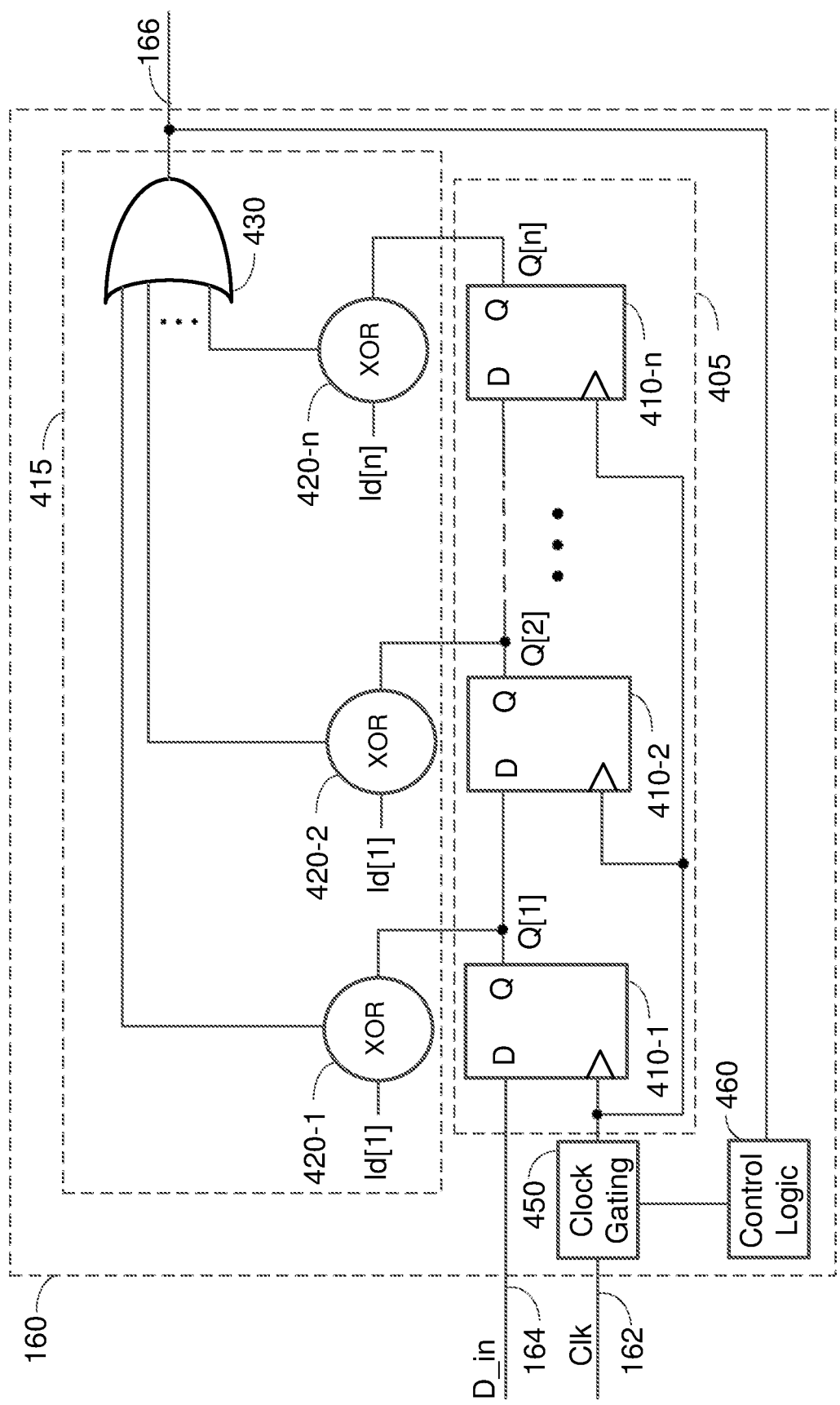
FIG. 4B shows an example in which the pattern detector includes a clock gating circuit according to certain aspects of the present disclosure.

In certain aspects, the pattern detector 160 also includes a clock gating circuit 450 and control logic 460, as shown in FIG. 4B. The clock gating circuit 450 is configured to selectively gate the clock signal Clk to the shifter register 405. The control logic 460 controls the clock gating circuit 450 based on the output 166 of the pattern detector 160. Before a pattern match, the control logic 460 causes the clock gating circuit 450 to pass the clock signal Clk to the shift register 405. In this case, the shift register 405 operates as discussed above. When the pattern detector 160 detects a pattern match, the control logic 460 causes the clock gating circuit 450 to gate the clock signal Clk to the shift register 405. This conserves power by stopping dynamic power consumption in the pattern detector 160. In addition, gating the clock signal Clk causes the pattern detector 160 to hold the pattern detection signal at the output 166. This is because gating the clock signal Clk freezes the output of the shift register 405. After the clock signal Clk is gated, the control logic 460 may cause the clock gating circuit 450 to un-gate the clock signal Clk when the control logic 460 receives a reset signal, e.g., from a system controller (not shown). For example, the system controller may send the reset signal when the serial-to-parallel converter 110 is to receive new serial data with a pattern indicating a boundary of the new serial data.

As discussed above, the demultiplexer control signal of a demultiplexer control circuit is in an initial state before a pattern match. The initial state may be either a one or a zero. The bit mapping of the demultiplexer(s) in the corresponding stage depends on the initial state of the demultiplexer control signal. This may be demonstrated by way of the following examples shown in FIGS. 5A and 5B.

FIG. 5A shows an example of bit mapping for the 1:2 demultiplexer 118 in the first stage 115 of the serial-to-parallel converter 110. In this example, the 1:2 demultiplexer 118 is implemented with the 1:2 demultiplexer shown 210 in FIG. 2. The 1:2 demultiplexer 118 receives the input serial data stream D_in, and splits the serial data stream D_in into parallel data signals $D2^0$ and $D2^1$ when the demultiplexer control signal C1 provides the first clock signal.

In this example, the pattern detection signal has a logic value of one and a pattern match is detected at approximately time t1. Before the pattern match, the demultiplexer control signal C1 is held at an initial state of one. In response to the pattern match at time t1, the demultiplexer control signal C1 provides the first clock signal. In this example, the first edge of the first clock signal is a falling edge. This is because the first clock signal starts at one since the initial state of the demultiplexer control signal C1 is one. As a result, the first flip-flop 215 of the 1:2 demultiplexer 118 (shown in FIG. 2) latches the data bit D[3] in the serial data stream and outputs the latched data bit D[3] at the output corresponding to data signal $D2^0$. The second flip-flop 220 of the 1:2 demultiplexer (shown in FIG. 2) latches the next data bit D[4] in the serial data stream on a rising edge of the first clock signal and outputs the latched data bit D[4] at the output corresponding to data signal $D2^1$. In this case, odd numbered data bits (i.e., D[3], D[5], D[7], . . . ) of the serial data stream D_in are mapped to the data signal $D2^0$, and even numbered data bits (i.e., D[4], D[6], D[8], . . . ) of the serial data stream D_in are mapped to the data signal $D2^1$.

FIG. 5B shows an example in which the initial state of the demultiplexer control signal C1 is changed to zero. In response to the pattern match at time t1, the demultiplexer control signal C1 provides the first clock signal, same as before. However, in this example, the first edge of the first clock signal is a rising edge instead of a falling edge (as was the case in FIG. 5A). This is because the first clock signal starts at zero since the initial state of the demultiplexer control signal C1 is zero in this case. As a result, the second flip-flop 220 of the 1:2 demultiplexer 118 (shown in FIG. 2) latches the data bit D[3] in the serial data stream and outputs the latched data bit D[3] at the output corresponding to data signal $D2^1$. The first flip-flop 215 of the 1:2 demultiplexer (shown in FIG. 2) latches the next data bit D[4] in the serial data stream on a falling edge of the first clock signal and outputs the latched data bit D[4] at the output corresponding to data signal $D2^0$. In this case, odd numbered data bits (i.e., D[3], D[5], D[7], . . . ) of the serial data stream D_in are mapped to the data signal $D2^1$, and even numbered data bits (i.e., D[4], D[6], D[8], . . . ) of the serial data stream D_in are mapped to the data signal $D2^0$. This is the reverse of the bit mapping shown in FIG. 5A.

Thus, FIGS. 5A and 5B show that the bit mapping of the 1:2 demultiplexer 118 may be programmed by programming the initial state of the corresponding demultiplexer control signal. The same principle applies to the other 1:2 demultiplexers and demultiplexer control circuits 140, 142, 145 and 147 in the serial-to-parallel converter 110. Thus, the bit mapping of the serial-to-parallel converter 110 may be programmed by programming the initial states of the demultiplexer control signals C1 to C4.

In this regard, FIG. 1 shows an example in which programmable bit mapping is incorporated into the serial-to-parallel converter 110 by programming the initial states of the demultiplexer control signals C1 to C4 according to certain aspects. In this example, each of the demultiplexer control circuits 140, 142, 145 and 147 has a respective control input 182, 184, 186 and 188 configured to receive a respective initial-state control signal (labeled "Init_state_1" to "Init_state_4"). Each of the demultiplexer control circuits 140, 142, 145 and 147 is configured to set the initial state of the respective demultiplexer control signal C1 to C4 based on the respective initial-state control signal Init_state_1 to Init_state_4. In one example, each initial-state control signal Init_state_1 to Init_state_4 specifies whether the initial state of the respective demultiplexer control signal C1 to C4 is to be set to one or zero. If a demultiplexer control circuit receives an initial-state control signal specifying an initial state of one, then the demultiplexer control circuit sets the initial state of the respective demultiplexer control signal to one. If a demultiplexer control circuit receives an initial-state control signal specifying an initial state of zero, then the demultiplexer control circuit sets the initial state of the respective demultiplexer control signal to zero.

The bit mapping of the serial-to-parallel converter 110 may be programmed by programming the initial states of the demultiplexer control signals C1 to C4 using the initial-state control signals Init_state_1 to Init_state_4. Depending on the desired bit map for the serial-to-parallel converter 110, all of the demultiplexer control signals C1 to C4 may be programmed to an initial state of one, all of the demultiplexer control signals C1 to C4 may be programmed to an initial output state of zero, or one or more of the demultiplexer control signals may be programmed to an initial state of one while other ones of the demultiplexer control signals are programmed to an initial state of zero.

In certain aspects, each of the initial-state control signals Init_state_1 to Init_state_4 may have a control value (e.g., a bit-value or a multi-bit value) indicating whether the initial state of the respective demultiplexer control signal C1 to C4 is to be set to one or zero. For example, a first control value may indicate an initial state of one and a second control value may indicate an initial state of zero. In this example, a demultiplexer control circuits sets the initial state of its demultiplexer control signal to one if the respective initial-state control signal has the first control value, and sets the initial state of its demultiplexer control signal zero to zero if the respective initial-state control signal has the second control value.

In certain aspects, the serial-to-parallel converter 110 includes a controller 180 configured to output the initial-state control signals Init_state_1 to Init_state_4 to the demultiplexer control circuits 140, 142, 145 and 147. For ease of illustration, the individual connections between the controller 180 and the demultiplexer control circuits 140, 142, 145 and 147 are not explicitly shown in FIG. 1. In one example, the controller 180 may include a register 185 that stores the control value for each of the initial-state control signals Init_state_1 to Init_state_4. In this example, the controller 180 may output each initial-state control signal by outputting the respective control value stored in the register 185 to the respective demultiplexer control circuit. The register 185 may be writable, allowing the initial states of the demultiplexer control signals C1 to C4 (and hence the bit mapping of the serial-to-parallel converter 110) to be programmed by writing the control values of the initial-state control signals into the register 185.

Note that setting the initial state of a demultiplexer control signal also sets the initial state of the respective clock signal that is output in response to the pattern detection signal. For example, if the initial state of a demultiplexer control signal is set to one, then the initial state of the respective clock signal is also set to one. This is because, when the respective clock signal is output in response to the pattern detection signal, the respective clock signal starts at one. An example of this is shown in FIG. 5A discussed above. If the initial state of a demultiplexer control signal is set to zero, then the initial state of the respective clock signal is also set to zero.

This is because, when the respective clock signal is output in response to the pattern detection signal, the respective clock signal starts at zero. An example of this is shown in FIG. 5B discussed above. Thus, the initial-state control signals Init_state_1 to Init_state_4 also program the initial states of the clock signals that are output by the demultiplexer control circuits 140, 142, 145 and 147 in response to the pattern detection signal. For example, a clock signal may be set to an initial state of one when the respective initial-state control signal has the first control value, and set to an initial state of zero when the respective initial-state control signal has the second control value.

Thus, aspects of the present disclosure provide the ability to program the mapping of serial data to parallel data in the serial-to-parallel converter 110 by programming the initial states of the demultiplexer control signals C1 to C4. This reduces or eliminates the need for additional hardware following the serial-to-parallel converter to perform bit alignment and mapping of the parallel data. As discussed above, the additional hardware may include multibit-XOR gates, an align FIFO, a match engine, a barrel shifter, and/or other components. By reducing or eliminating the additional hardware, aspects of the present disclosure reduce the power and/or area needed for SerDes.

Figure 6:
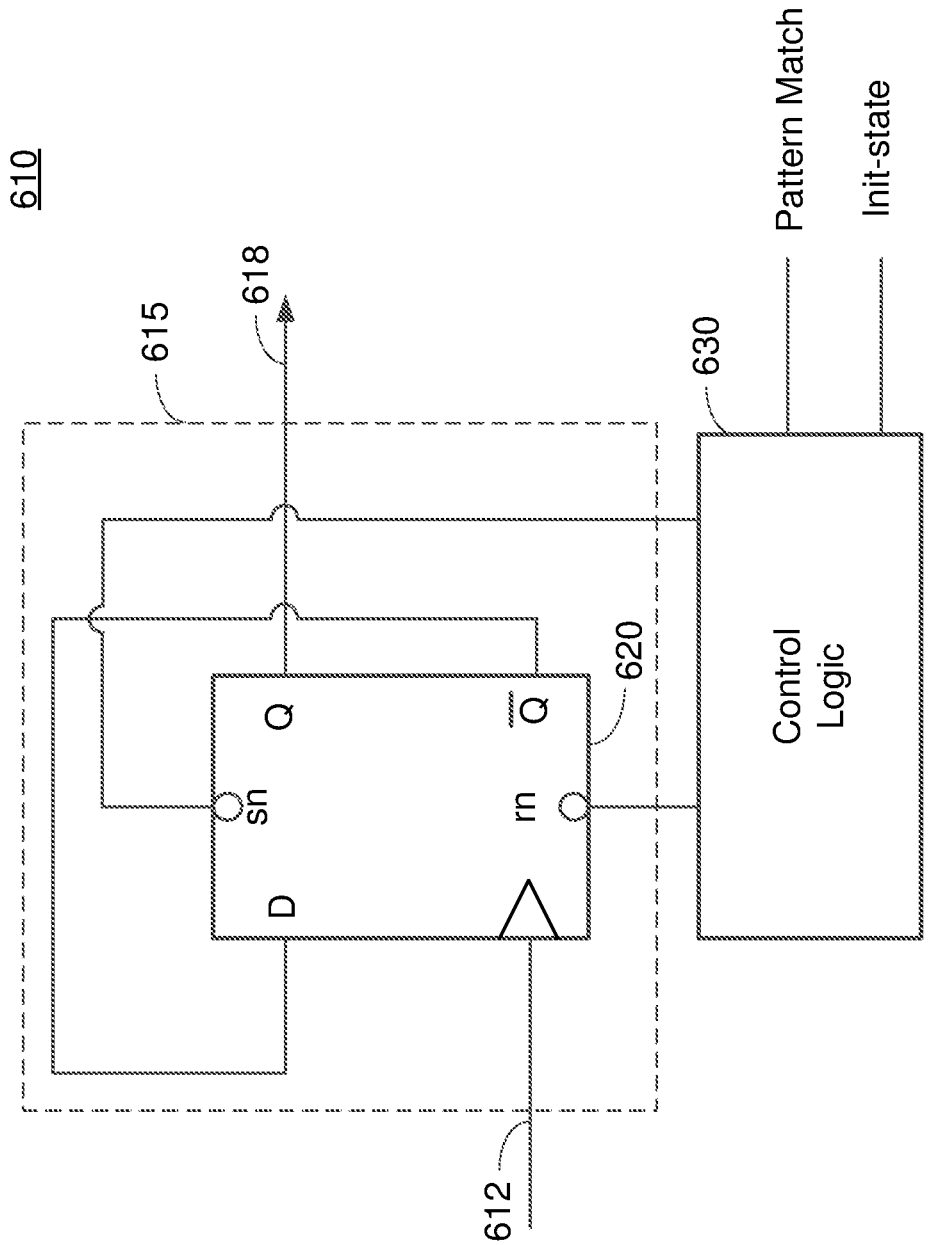
FIG. 6 shows an exemplary implementation of a demultiplexer control circuit configured to output a control signal with a programmable initial state according to certain aspects of the present disclosure.

FIG. 6 shows an exemplary implementation of a demultiplexer control circuit 610 according to some aspects of the present disclosure. The demultiplexer control circuit 610 may be used to implement each of the demultiplexer control circuits 140, 142, 145 and 147 in FIG. 1 (i.e., each of the demultiplexer control circuits in FIG. 1 may be a separate instance of the demultiplexer control circuit 610).

In this example, the demultiplexer control circuit 610 includes a clock divider 615 having an input 612 and an output 618. The demultiplexer control signal of the demultiplexer control circuit 610 is output from the output 618 of the clock divider 615. The clock divider 615 is configured to receive a clock signal at the input 612, divide the frequency of the received clock signal by two to generate a clock signal having half the frequency of the received clock signal, and output the generated clock signal as the respective demultiplexer control signal at the output 618. For example, if the demultiplexer control circuit 610 implements the demultiplexer control circuit 140 in FIG. 1, then the clock divider 615 receives the clock signal Clk at the input 612, divides the frequency of the input clock signal by two to generate the first clock signal discussed above, and outputs the first clock signal as the demultiplexer control signal C1 at the output 618. If the demultiplexer control circuit 610 implements the demultiplexer control circuit 142 in FIG. 1, then the clock divider 615 receives the first clock signal from the first demultiplexer control circuit 140 at the input 612, divides the frequency of the first clock signal by two to generate the second clock signal discussed above, and outputs the second clock signal as the demultiplexer control signal C2 at the output 618.

In the example in FIG. 6, the clock divider 615 includes a flip-flop 620 having a data input (labeled "D"), a non-inverting output (labeled "Q"), an inverting output (labeled "Q̄"), and a clock input. The inverting output (labeled "Q̄") of the flip-flop 620 is coupled to the data input (labeled "D") of the flip-flop 620. The clock input of the flip-flop 620 is coupled to the input 612 of the clock divider 615. The non-inverting output (labeled "Q") of the flip-flop 620 is coupled to the output 618 of the demultiplexer control circuit 610.

In normal operation, the flip-flop 620 latches the logic value at the data input (labeled "D") of the flip-flop 620 on a rising edge of the clock signal input to the clock divider 615, outputs the latched logic value at the non-inverting output (labeled "Q"), and outputs the inverse of the latched logic value at the inverting output (labeled "Q̄"). Coupling the inverting output (labeled "Q̄") of the flip-flop 620 to the data input (labeled "D") of the flip-flop 620 causes the non-inverting output (labeled "Q") of the flip-flop 620 to switch (i.e., toggle) logic states on each rising edge of the clock signal input to the clock divider 615. This produces a clock signal at the non-inverting output (labeled "Q") of the flip-flop 620 having half the frequency of the clock signal input to the clock divider 615. Thus, the exemplary configuration of the flip-flop 620 shown in FIG. 6 implements a divide-by-two clock divider. Note that, in this example, the data input (labeled "D") of the flip-flop 620 does not receive incoming data. Rather the data input (labeled "D") is coupled to the inverting output (labeled "Q̄") to generate the respective clock signal.

In the example in FIG. 6, the flip-flop 620 has an inverting set input (labeled "sn"). When a logic value of zero is input to the inverting set input, the flip-flop 620 is in a set state. In the set state, the flip-flop 620 outputs a static logic value of one at the non-inverting output (labeled "Q"). Thus, when the flip-flop 620 is in the set state, the clock divider 615 outputs a static logic value of one to the demultiplexer(s) in the corresponding stage. In this example, the set state corresponds to the initial state of one discussed above. Thus, the demultiplexer control signal of the demultiplexer control circuit 610 may be programmed to an initial state of one by setting the flip-flop 620 to the set state. When a logic value of one is input to the inverting set input, the flip-flop 620 is released from the set state.

In the example in FIG. 6, the flip-flop 620 also has an inverting reset input (labeled "rn"). When a logic value of zero is input to the inverting reset input, the flip-flop 620 is in a reset state. In the reset state, the flip-flop 620 outputs a static logic value of zero at the non-inverting output (labeled "Q"). Thus, when the flip-flop 620 is in the reset state, the demultiplexer control circuit 610 outputs a static logic value of zero to demultiplexer(s) in the corresponding stage. In this example, the reset state corresponds to the initial state of zero discussed above. Thus, the demultiplexer control signal of the demultiplexer control circuit 610 may be programmed to an initial state of zero by setting the flip-flop 620 to the reset state. When a logic value of one is input to the inverting reset input, the flip-flop 620 is released from the reset state.

The demultiplexer control circuit 610 also includes control logic 630 that controls the initial state of the demultiplexer control signal by controlling the set/reset state of the flip-flop 620. To set the demultiplexer control signal of the demultiplexer control circuit 610 to an initial state of one, the control logic 630 asserts the set state of the flip-flop 620 by outputting a zero to the inverting set input (labeled "sn") of the flip-flop 620. To set the demultiplexer control signal of the demultiplexer control circuit 610 to an initial state of zero, the control logic 630 asserts the reset state of the flip-flop 620 by outputting a zero to the inverting reset input (labeled "rn") of the flip-flop 620.

The control logic 630 receives the respective initial-state control signal (labeled "Init-state") from the controller 180 and the pattern detection signal from the pattern detector 160. Before pattern match, the control logic 630 asserts the set state or the reset state of the flip-flop 620 based on the initial state specified by the respective initial-state control signal. If the initial-state control signal specifies an initial state of one (e.g., the state control signal has the first control value discussed above), then the control logic 630 outputs a zero to the inverting set input of the flip-flop 620 to place the flip-flop 620 in the set state and outputs a one to the inverting reset input of the flip-flop 620. If the initial-state control signal specifies an initial state of zero (e.g., the state control signal has the second control value discussed above), then the control logic 630 outputs a zero to the inverting reset input of the flip-flop 620 to place the flip-flop 620 in the reset state and outputs a one to the inverting set input of the flip-flop 620.

When the control logic 630 receives the pattern detection signal indicating a pattern match, the control logic 630 releases the flip-flop 620 from the set state or the reset state depending on the initial state of the respective demultiplexer control signal. If the flip-flop 620 is in the set state (i.e., initial state of one), then the control logic 630 releases the flip-flop 620 from the set state by outputting a one to the inverting set input of the flip-flop 620. After being released from the set state, the flip-flop 620 starts generating the respective clock signal. In this case, the clock signal starts from an initial state of one and the first edge of the clock signal is a falling edge. If the flip-flop 620 is in the reset state (i.e., initial state of zero), then the control logic 630 releases the flip-flop 620 from the reset state by outputting a one to the inverting reset input of the flip-flop 620. After being released from the reset state, the flip-flop 620 starts generating the respective clock signal. In this case, the clock signal starts from an initial state of zero and the first edge of the clock signal is a rising edge.

The control logic 630 may be implemented with any combination of logic gates that performs the functions discussed above. Although the flip-flop 620 in the example in FIG. 6 has an inverting set input and an inverting reset input, it is to be appreciated that this need not be the case. For example, the flip-flop 620 may have a non-inverting set input. In this example, the control logic 630 outputs a logic one to the non-inverting set input to place the flip-flop 620 in the set state, and outputs a logic zero to the non-inverting set input to release the flip-flop 620 from the set state. Similarly, the flip-flop 620 may have a non-inverting reset input. In this example, the control logic 630 outputs a logic one to the non-inverting reset input to place the flip-flop 620 in the reset state, and outputs a logic zero to the non-inverting reset input to release the flip-flop 620 from the reset state. Also, it is to be appreciated that the clock signal may be output from the inverting output (labeled "Q") of the flip-flop 620 instead. In this case, the initial state of the clock signal may be the inverse of the initial state for the case where the clock signal is output from the non-inverting output (labeled "Q").

Figure 7:
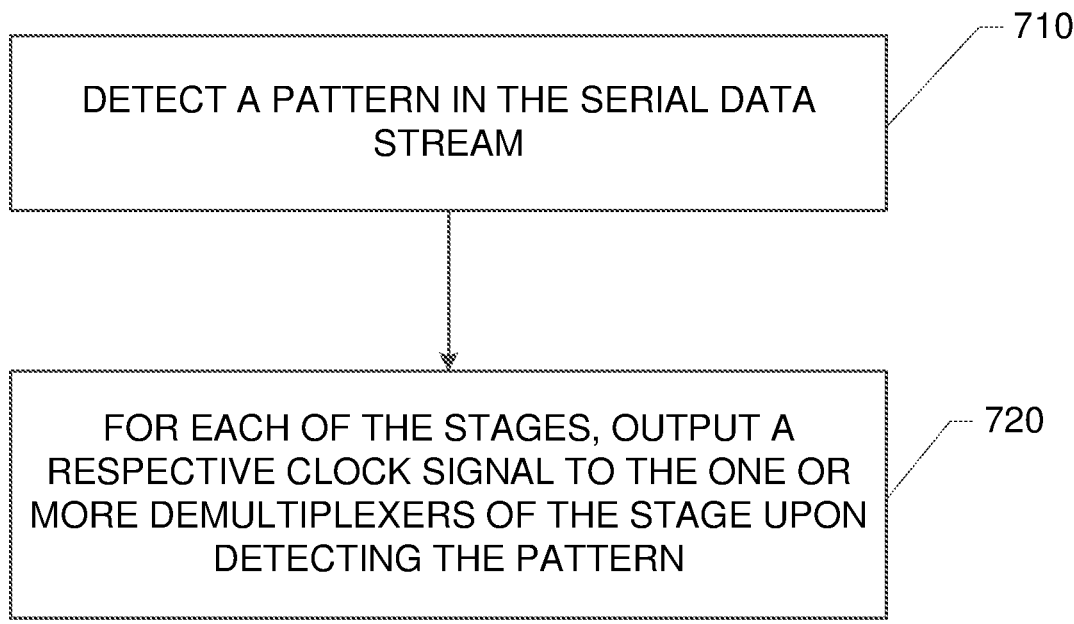
FIG. 7 is a flowchart illustrating a method for operating a serial-to-parallel converter according to certain aspects of the present disclosure.

FIG. 7 is a flowchart illustrating a method 700 for operating a serial-to-parallel converter. The serial-to-parallel converter includes multiple cascaded stages (e.g., stages 115, 120, 125 and 130) configured to convert a serial data stream into multiple parallel data signals, and each of the stages comprises one or more demultiplexers.

At block 710, a pattern in the serial data stream is detected. The pattern may indicate a word boundary in the serial data stream, and the pattern may include a sequence of bits (e.g., Id[1] to Id[n]).

At block 720, for each of the stages, a respective clock signal is output to the one or more demultiplexers of the stage upon detecting the pattern. In one example, an initial state of each of the clock signals may be programmed based on a desired bit mapping for the serial-to-parallel converter. The programming may include receiving an initial-state control signal (e.g., Init_state_1 to Initial_state_4) for each of the clock signals, and setting an initial state of each of the clock signals based on the respective initial-state control signal. Setting the initial state of each of the clock signals may further optionally include, for each of the clock signals, setting the initial state of the clock signal to a logic one if the respective initial-state control signal has a first value and setting the initial state of the clock signal to a logic zero if the respective initial-state control signal has a second value.

It is to be appreciated that the present disclosure is not limited to the exemplary terms used above to describe aspects of the present disclosure. For example, it is to be appreciated that a rising edge may also be referred to as a positive edge and a falling edge may also be referred to as a negative edge. In another example, set and reset may also be referred to as preset and clear, respectively.

The pattern detector 160 and the controller 180 discussed above may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A serial-to-parallel converter, comprising:
   multiple cascaded stages configured to convert a serial data stream into multiple parallel data signals, wherein each of the stages comprises one or more demultiplexers;
   demultiplexer control circuits, wherein each of the demultiplexer control circuits is coupled to the one or more demultiplexers of a respective one of the stages; and
   a pattern detector coupled to the demultiplexer control circuits, wherein the pattern detector is configured to detect a pattern in the serial data stream; and upon detecting the pattern, output a pattern detection signal to the demultiplexer control circuits.

2. The serial-to-parallel converter of claim 1, wherein, in response to the pattern detection signal, each of the demultiplexer control circuits is configured to output a respective clock signal to the one or more demultiplexers of the respective one of the stages.

3. The serial-to-parallel converter of claim 2, wherein each of the demultiplexer control circuits is configured to:
receive a respective initial-state control signal; and
set an initial state of the respective clock signal based on the respective initial-state control signal.

4. The serial-to-parallel converter of claim 3, wherein each of the demultiplexer control circuits is configured to:
set the initial state of the respective clock signal to a logic one if the respective initial-state control signal has a first value; and
set the initial state of the respective clock signal to a logic zero if the respective initial-state control signal has a second value.

5. The serial-to-parallel converter of claim 2, wherein a first one of the demultiplexer control circuits comprises:
a first clock divider configured to divide a frequency of an input clock signal to generate the respective clock signal.

6. The serial-to-parallel converter of claim 5, wherein a second one of the demultiplexer control circuits comprises:
a second clock divider configured to divide a frequency of the clock signal of the first one of the demultiplexer control circuits to generate the respective clock signal.

7. The serial-to-parallel converter of claim 5, wherein the first clock divider divides the frequency of the input clock signal by two.

8. A serial-to-parallel converter, comprising:
a demultiplexer configured to receive a serial data stream and split the serial data stream into first and second parallel data signals;
a demultiplexer control circuit coupled to the demultiplexer; and
a pattern detector coupled to the demultiplexer control circuit, wherein the pattern detector is configured to:
detect a pattern in the serial data stream; and
upon detecting the pattern, output a pattern detection signal to the demultiplexer control circuit.

9. The serial-to-parallel converter of claim 8, wherein the pattern detector comprises:
a shifter register configured to output n bits of the serial data stream; and
a comparator configured to compare the n bits of the serial data stream with n bits of the pattern, and output the pattern detection signal if the n bits of the serial data stream match the n bits of the pattern.

10. The serial-to-parallel converter of claim 8, wherein, in response to the pattern detection signal, the demultiplexer control circuit is configured to output a clock signal to the demultiplexer.

11. The serial-to-parallel converter of claim 10, wherein the demultiplexer comprises:
a first flip-flop configured to latch a first bit of the input serial data stream on a falling edge of the clock signal, and output the latched first bit at a first output; and
a second flip-flop configured to latch a second bit of the input serial data stream on a rising edge of the clock signal, and output the latched second bit at a second output.

12. The serial-to-parallel converter of claim 10, wherein the demultiplexer control circuit comprises:

a clock divider configured to divide a frequency of an input clock signal to generate the clock signal.

13. The serial-to-parallel converter of claim 12, wherein the clock divider comprises:
a flip-flop having a data input, a non-inverting output, an inverting output, and a clock input, wherein the clock input receives the input clock signal, the data input is coupled to the inverting output, and the clock signal is output at the non-inverting output.

14. The serial-to-parallel converter of claim 13, wherein the demultiplexer control circuit comprises:
control logic coupled to the flip-flop, wherein the control logic is configured to:
receive the pattern detection signal and an initial-state control signal;
set the flip-flop to a set state or a reset state based on the initial-state control signal; and
release the flip-flop from the set state or the reset state in response to the pattern detection signal.

15. The serial-to-parallel converter of claim 14, wherein the control logic is configured to:
set the flip-flop to the set state if the initial-state control signal has a first logic value; and
set the flip-flop to the reset state if the initial-state control signal has a second value.

16. A method for operating a serial-to-parallel converter, wherein the serial-to-parallel converter includes multiple cascaded stages configured to convert a serial data stream into multiple parallel data signals, and each of the stages comprises one or more demultiplexers, the method comprising:
detecting a pattern in the serial data stream; and
for each of the stages, outputting a respective clock signal to the one or more demultiplexers of the stage upon detecting the pattern.

17. The method of claim 16, further comprising:
receiving an initial-state control signal for each of the clock signals; and
setting an initial state of each of the clock signals based on the respective initial-state control signal.

18. The method of claim 17, wherein setting the initial state of each of the clock signals based on the respective initial-state control signal comprises:
for each of the clock signals,
setting the initial state of the clock signal to a logic one if the respective initial-state control signal has a first value; and
setting the initial state of the clock signal to a logic zero if the respective initial-state control signal has a second value.

19. The method of claim 16, further comprising:
generating a first one of the clock signals by dividing a frequency of an input clock signal using a clock divider to generate the first one of the clock signals.

20. The method of claim 19, wherein the clock divider includes a flip-flop, and the method further comprises:
receiving an initial-state control signal;
setting the flip-flop to a set state or a reset state based on the initial-state control signal;
releasing the flip-flop from the set state or the reset state upon detecting the pattern.

21. The method of claim 20, wherein setting the flip-flop to the set state or the reset state comprises:
setting the flip-flop to the set state if the initial-state control signal has a first logic value; and setting the flip-flop to the reset state if the initial-state control signal has a second value.

* * * * *